United States Patent [19]

Kvaternik

[11] 4,035,723
[45] July 12, 1977

[54] PROBE ARM

[75] Inventor: Joseph Kvaternik, Belmont, Calif.

[73] Assignee: Xynetics, Inc., Santa Clara, Calif.

[21] Appl. No.: 622,813

[22] Filed: Oct. 16, 1975

[51] Int. Cl.² ............... G01R 1/06; G01R 31/02
[52] U.S. Cl. ........................ 324/158 P; 324/72.5
[58] Field of Search .......... 324/158 P, 158 F, 72.5

[56] References Cited

U.S. PATENT DOCUMENTS

| 3,731,191 | 5/1973 | Bullard et al. | 324/158 P |
| 3,944,922 | 3/1976 | Chambers et al. | 324/158 P |

Primary Examiner—Rudolph V. Rolinec
Assistant Examiner—Ernest F. Karlsen

Attorney, Agent, or Firm—Ellsworth R. Roston

[57] ABSTRACT

A probe including an arm providing structure for fixedly mounting and preloading a leaf spring. A probe tip is fixed to the leaf spring and extends through a guide means on the probe arm. Provision is made for clearance in the fit between the guide and the probe tip so that a predetermined, controlled amount of bending of the tip is allowed when contact is made with a circuit to be tested. Consequently, the tip may move across the circuit in a first direction upon the initial contact. Continued relative movement will cause the tip to retract through the guide means, thereby forcing it to move across the circuit n the opposite direction.

16 Claims, 7 Drawing Figures

PROBE ARM

BACKGROUND OF THE INVENTION

In the field of microelectronics, component size has been reduced significantly, resulting in an increase of the complexity involved with testing of the components. When manufacturing semi-conducting devices, hybrid circuitry, substrates for such devices and circuitry, etc., it is preferred that the components be tested to determine if they may be used reliably in the end product. Generally, it is desirable to conduct such testing before the microminiature devices are installed in the components of the end product. Such testing might be desirable, for example, in testing digital watch circuitry and modules, laser trimming, abrasive trimming, etc.

In many cases, it is desirable to test the microminiature device even before a terminal lead has been applied thereto, in view of the cost and difficulty in applying such leads.

Due to the minute size of the components being tested, it is frequently necessary to provide small probes which can be precisely located relative to a workpiece bearing the structure to be tested. Since the structure is usually of extremely small size, it is also often necessary to provide high power microscopes through which an operator can view the relationship of the circuitry being tested and the tip of the probe.

In many instances, the workpiece upon which the particular object to be tested is mounted also contains several other similar objects, such as various microcircuits, which are to be tested simultaneously. For example, the workpiece might be a ceramic substrate which may have been subjected to baking or heating during its production. In such a case, the substrate is often slightly warped or, at least, not perfectly flat. Obviously, each ceramic substrate will not be warped or disfigured identically to every other substrate. Consequently, some means must be provided to allow each probe tip to come into contact with the object being tested without damaging the probe, the object, or the substrate. For example, in some instances it may be that the object being tested will, upon successful completion of the test, have a lead wire bonded thereto. In many cases, it is required that the lead wire be bonded to virgin, or relatively unscratched material on the device since a junction will not form at a scratched or abraded location on the surface.

Thus, it is desirable to minimize the amount of scratching, commonly referred to as "scrubbing," which takes place between the probe tip and the object being tested. On the other hand, it is often desirable not to totally eliminate such scrubbing since it may be that the face of the object being tested is oxidized; it is necessary for the probe tip to get through the oxide in order to conduct the test properly.

In other words, some scrubbing is desirable, but it is preferable that the scrubbing be confined to a very small area so as to minimize damage to the surface of the object.

As suggested previously, it is often probable that the circuitry on a substrate will be at slightly different levels, relative to a common plane, due to warpage or other phenomena. In other words, some of the circuitry on a substrate will be at a higher elevation than other circuitry. In order that the lowest circuitry may come into suitable contact and be sufficiently scrubbed by its associated probe, it is necessary that provision be made for some amount of overtravel between the highest circuitry pad or object and its associated probe. While this is necessary, it is also imperative that the probes associated with the more elevated circuitry pads neither damage those circuits nor be damaged themselves during testing.

In the prior art, it has been known to provide probes for such testing and various techniques have been employed in an attempt to minimize the relative motion between the probe tip and the pad for the circuitry being tested. With all of these devices, however, it has been necessary for the operator to align the probe tip near one edge of the pad just before contact therebetween so that relative movement between them will cause the tips to scrub across at least a portion of the pad to achieve the desired contact for testing. With all of these prior art devices, the scrubbing takes place in varying degrees, dependent upon the relative elevation of the pads, across a substantially large surface area. For example, if the width of the pad is 6 mils, the scrubbing might occur across anywhere from 10% to 90% thereof. Thus, the possibility of applying a lead or other device to the pad may be substantially reduced. Further, with the prior art devices, the force exerted between the probe tip and the pad has been directly proportional to the distance they move relative to one another after initial contact. In other words, those pads which are most elevated relative to the substrate are subjected to a greater probe tip pressure than those further away.

As can be seen from the above discussion of the prior art deficiencies, it is desirable to provide a probe tip which will sufficiently scrub the surface of a device to be tested so that the oxide layer may be penetrated, without scrubbing so much of the surface that the possibility of attaching a lead thereto or performing other work thereon is significantly reduced.

SUMMARY OF THE INVENTION

The present invention relates to such a probe and its method of use.

The invention may be employed in a probe which produces a substantially constant pressure on the probe tip regardless of the distance the latter must travel when in contact with an object to be tested. Further, provision is made in the relative size of the probe elements so that scrubbing between the probe tip and the object being tested is vastly reduced, while still ensuring complete penetration of the oxide layer.

In the preferred embodiment of this invention, the probe employs a leaf spring which may be preloaded with a predetermined force. To the leaf spring, a probe tip may be fixed so as to move through a guide mounted on the probe when contact occurs between the tip and the device to be tested.

A structural relationship of predetermined clearance may be employed between the guide and the probe tip so that the latter will bend, but not slide, through the guide, when an object to be tested is initially contacted by the probe. Subsequent additional relative motion between the probe and the object being tested will then cause the tip to slide through the guide.

Surprisingly, it has been discovered that the initial bending of the tip on contact with the object being tested causes the tip to scrub across a portion of the surface of the test object in a direction opposite to that which might be expected. Then, subsequent additional motion between the object and the probe causes a retraction of the tip into the guide, resulting in the tip scrubbing back through the first scrubbing just described, in the same direction as would be expected with the prior art tips. Thus, there is one area on the device being tested which is scrubbed in both directions, i.e., one-half the amount of surface area scrubbing which might have occurred with the prior art probes.

Also, the provision of a substantially constant force regardless of the degree of relative motion between the test object and the probe prevents the probe from damaging the object.

Those skilled in the art, upon perusal of the following detailed description, together with the drawing, will readily understand that the present invention may be employed in a variety of structures, many of which may not even resemble that depicted and described here but, nonetheless, will use the invention as defined in the appended claims.

DETAILED DESCRIPTION

Figure 1:
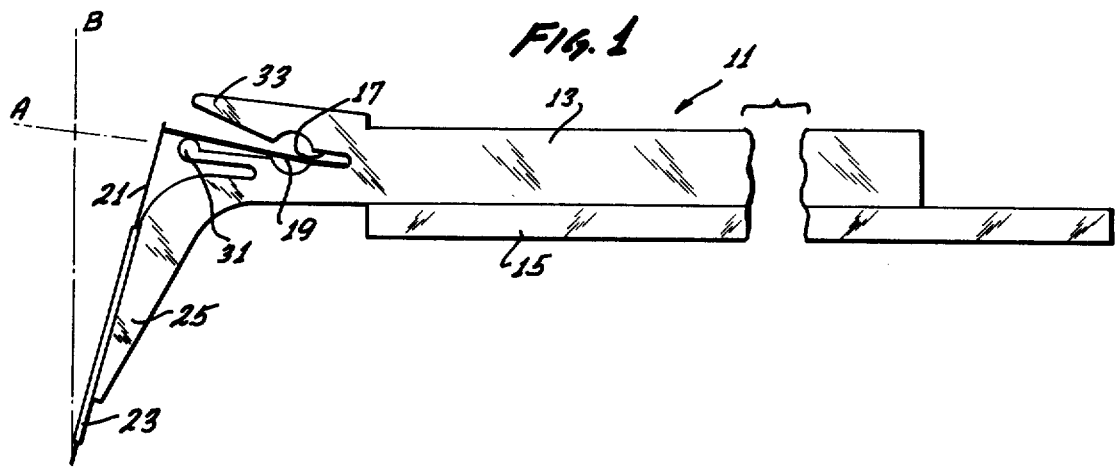
FIG. 1 comprises a side elevation of a probe formed in accordance with the presently preferred embodiment of the present invention.

One probe which is formed in accordance with the present invention has been generally illustrated at 11 in FIG. 1 and comprises a probe arm 13 which may be suitably mounted, such as by soldering, to a probe support 15. Near the outer end of the probe, a slot 17 may be formed, into which a leaf spring 19 may be fastened, such as by soldering. Near the outer end of the leaf spring, a probe tip 21 may be suitably connected so as to pass through a guide 23 fastened to the outer end 25 of the probe arm 13. The guide 23 may be provided of any suitable configuration which will serve to prevent removal of the tip 21 therefrom although, in the drawing it has been depicted as a tubular configuration.

The leaf spring 19 may be biased into a predetermined angular configuration, relative to the line A, for example, by a preload arm 31, which may be formed in the shape illustrated. The preload arm may be vertically adjustable so that, during manufacture, all probe tips can be placed into alignment relative to a common horizontal plane, to within plus or minus 1 mil without any change on the preload of the spring. On the other hand, the spring can thus be provided with a preload force of predetermined magnitude, if desired.

Near the upper portion of the slot 17, an elastic limit stop 33 may be provided to prevent further bending of the leaf spring, if the latter should ever reach that position.

Preferably, the guide 23 and probe tip 21 are oriented at an angle of approximately 15° relative to a vertical axis B passing through the end of the probe tip in its fully extended position. No scrubbing would occur between the end of the tip and the object being tested if the tip 21 and guide 23 were vertically oriented. Also, in such a case it would be impossible for the operator to see the tip actually enter into contact with the object being tested through the microscope, since his view would be obstructed by the guide and the forward end of the probe arm 25.

Providing the tip 21 at an angle of approximately 15° relative to vertical allows the operator to see the tip enter into contact with the pad, while producing minimal scrubbing. At the same time, the 15° angle, which is considered to be optimum, does not result in any effective vertical loss of height which may otherwise occur between the end of the guide 23 and the contact end of the tip 21. In other words, if an angle of greater than 15° were employed, the end of the guide 23 would get so close to the device being tested as to eliminate a large part of the advantage gained by the extension of the tip 21 beyond the end of the guide, unless the tube configuration is altered, such as by beveling, etc.

Figure 2:
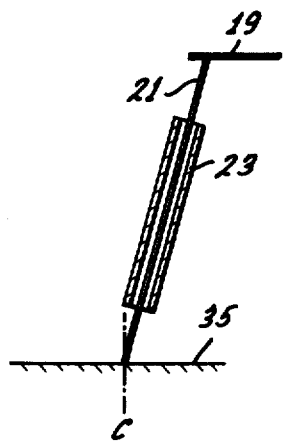
FIGS. 2–5 comprise greatly enlarged sectional views of a portion of the probe illustrated in FIG. 1, showing various stages of relative movement between the probe and the object being tested.

Referring now to FIG. 2, there is graphically depicted a guide 23 and a tip 21 in greatly enlarged scale, with the clearance between the tip and the guide greatly exaggerated for the purpose of this discussion. As seen in FIG. 2, the end of the tip is just entering into contact with an object to be tested, such as a circuit pad 35. The tip has contacted the pad at point C which, preferably, is relatively near the center of the pad. It is preferred that the point C be near the center of the pad since this is the easiest location for an operator to align the tip with. As will be discussed below, it has been necessary for the operator to align the prior art probes near one end of the pad; that is far more difficult to accomplish.

Figure 3:
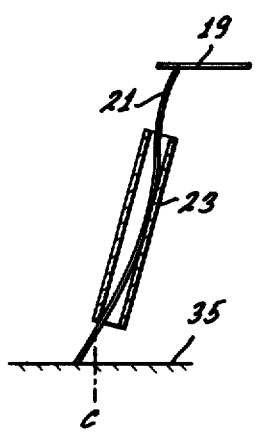

As seen in FIG. 3, the pad 35 has continued to move toward the guide 23, causing the probe tip 21 to assume a curved configuration, due to the relative motion, without causing any movement in the spring 19. Consequently, the end of the tip will move from the position C to the left, as viewed in FIG. 3, a short distance.

Figure 4:
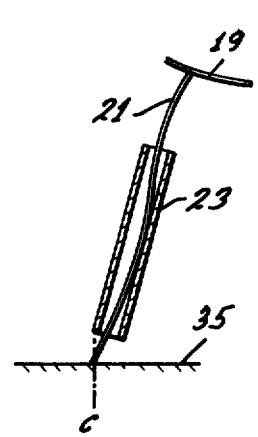

Referring now to FIG. 4, it is seen that there has been continued movement of the circuit pad 35 such that the tip 21 has now begun to be retracted into and through the guide, causing a movement of the spring 19. As the tip is thus retracted, it will move toward the right, i.e., back toward the point C as illustrated.

Figure 5:
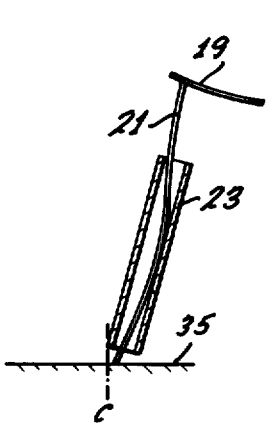

In FIG. 5, it can be seen that the circuit pad 35 has now moved to substantially its upper limit of movement, causing the tip to travel still further to the right beyond the point C.

Figure 6:
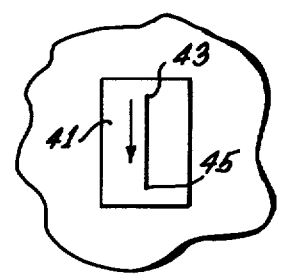
FIG. 6 comprises an enlarged graphic illustration to show the degree of scrubbing which may occur across an object being tested, utilizing a prior art probe.

In FIG. 6, there is shown a circuit pad 41 which has been tested by a prior art probe. With such a prior art device, the probe was initially aligned with a location 43 on the pad and, under continued relative motion between the pad and the probe, the probe scrubbed across the pad to a location 45. In other words, all scrubbing occurred in a single direction; if the probe was aligned with the center of the pad, it might have traveled right off the pad edge and beyond during the test.

Figure 7:
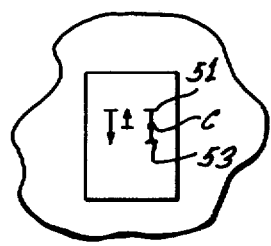
FIG. 7 comprises a graphic illustration similar to FIG. 6 which depicts the amount of scrubbing which might occur employing a probe formed in accordance with the present invention.

On the other hand, referring to FIG. 7, a probe formed in accordance with the present invention may be aligned near the center of the pad at point C (as in FIG. 2). Initial movement, as depicted in FIG. 3, will cause the tip to move to the location 51 as illustrated in FIG. 7. In the manner depicted in FIG. 5, the final movement will retract the tip to the location 53. Thus, it can be seen that the total area scrubbed utilizing the present invention is much smaller than that of the prior art devices.

Further, by providing that the tip shall be urged into contact with the pad by a single leaf spring, a substantially constant biasing force may be exerted on the tip so that the force generated between the end of the tip and the circuit pad is substantially constant and does not increase with increased movement therebetween. As a result, there is far less possibility of damaging the object being tested or the probe when the present invention is employed.

Those skilled in the art will now realize that the above-detailed description refers only to one physical embodiment of the present invention, and that the invention may be employed in a wide variety of structures within the scope of the following claims.

I claim:

1. A probe for testing a circuit pad, comprising
    a probe arm,
    a leaf spring,
    means for fixing said leaf spring to said probe arm for flexure of the leaf spring relative to the probe arm,
    means included in the probe arm for preloading a predetermined biasing force in said leaf spring to obtain the flexure of the leaf spring only after the predetermined biasing force on the leaf spring has been exceeded,
    hollow guide means disposed on said probe arm and extending along a predetermined angle relative thereto, and
    probe tip means extending through said guide means in loose relationship to the guide means and fixed to said leaf spring for providing an initial flexure of the probe tip within the guide means as the probe arm is moved toward the circuit pad and for providing movement of the probe tip in a first direction relative to the circuit pad in accordance with such flexure until the predetermined biasing force has been exceeded on the spring by the engagement between the circuit pad and the probe tip means and for then exerting a force on the spring to produce a movement of the spring and the probe tip means relative to the guide means to provide for movement of the probe tip relative to the circuit pad in a second direction opposite to the first direction.

2. The probe of claim 1 wherein said preloading means comprises
    means for adjustably positioning on the probe arm the portion of said leaf spring to which said probe tip means is attached.

3. The probe tip of claim 1 wherein
    said guide means and said probe tip means are of such predetermined relative sizes and shapes as to provide for relative movements between the guide means and the probe tip means in directions both parallel and perpendicular to the axes thereof.

4. A probe means for testing a circuit pad, comprising
    support means,
    spring means disposed on said support means,
    means disposed on said support means in cooperative relationship with the spring means for providing a particular preload on the spring means and for providing a movement of the spring means in a direction away from the circuit pad upon the imposition of a force against the spring means greater than the particular preload,
    hollow guide means supported by said support means at a particular acute angle to the circuit pad, and
    probe tip means extending through said guide means in loose relationship to said guide means for flexure within said guide means upon the exertion of a force against the probe tip means and for movement of the probe tip in a first direction relative to the circuit pad in accordance with such flexure the probe tip means extending at the particular acute angle to the circuit pad,
    said guide means and said probe tip means so relatively sized as to allow motion therebetween in a direction perpendicular to the direction in which said probe tip means is directed by engagement between the probe tip means and the circuit pad and to provide for movement of the probe tip relative to the circuit pad in a second direction opposite to the first direction in accordance with such perpendicular motion.

5. The probe means of claim 4 wherein said urging means comprises
    a leaf spring yieldably mounted near one end thereof to said support means and said tip means being fixed to the other end of said leaf spring.

6. The probe means of claim 5 including
    means included in the probe arm for exerting a preloaded biasing force on said leaf spring and means included in the probe arm for limiting the flexure of the leaf spring.

7. The probe means of claim 5 including
    means for adjustably locating the probe tip means of said probe means relative to a predetermined plane passing through said support means.

8. A method for testing a microelectronic device comprising
    providing a probe tip positioned losely within guide means attached to a probe arm,
    locating the probe tip above the device to be tested,
    biasing the probe tip relative to the probe arm with a predetermined force against movement in a direction away from the microelectronic device,
    moving the device and the probe arm relative to one another in a direction toward each other to create a contact therebetween and a force on the probe tip,
    initially bending said tip by continuing said step of relatively moving until the probe tip receives the predetermined force from the microelectronic device, thereby
    moving the tip in a first direction across the object, and
    further continuing said step of relatively moving after the predetermined force has been reached thereby moving the tip in a second direction across the object.

9. The method of claim 8 wherein the probe tip extends loosely through the guide means and
    said bending step is accomplished by
        moving at least a portion of the tip within the guide means in a direction opposite to the direction of the movement of the probe tip relative to the microelectronic device and
    said step of further continuing said step of relatively moving is accomplished by
        moving the tip in a direction substantially perpendicular to the direction of relative movement between the microelectronic device and the probe tip.

10. The method claim 8 including the step of initially disposing the probe tip in light contact with the microelectronic device.

11. The method of claim 8 including the step of preloading the predetermined force on a leaf spring means to which said tip is attached, thereby to impose the predetermined force on the probe tip and to inhibit the movement of the probe tip in the second direction until at least the predetermined force has been imposed on the probe tip by the microelectronic device.

12. In combination for testing a microelectronic circuit on a semiconductor chip,
 a probe arm,
 a leaf spring supported by the probe arm,
 means included in the probe arm for biasing the leaf spring on the probe arm with a particular force,
 a probe tip coupled to the leaf spring in a direction transverse to the probe arm and biased toward the microelectronic circuit by the particular force on the leaf spring,
 guide means supported by the probe arm and enveloping the probe tip in a loose relationship to provide initially for a bending of the probe tip within the guide means for forces between the probe tip and the microelectronic circuit less than the particular value, thereby producing movement of the probe tip in a first direction along the microelectronic circuit, and to provide subsequently for a displacement of the guide means relative to the microelectronic circuit for forces between the probe tip and the microelectronic circuit greater than the particular value, thereby producing movement of the probe tip along the microelectronic circuit in a second direction opposite to the first direction.

13. The combination set forth in claim 12, including means disposed on the probe arm for limiting the movement of the leaf spring in accordance with the displacement of the probe tip from the microelectronic circuit.

14. The combination set forth in claim 12 wherein the biasing means are adjustable to adjust the particular force on the leaf spring.

15. The combination set forth in claim 14 wherein the guide means constitutes a hollow tube.

16. The combination set forth in claim 15 wherein the leaf spring is attached to the probe arm at one end and the biasing means acts upon the leaf spring near the opposite end and the probe tip is attached to the opposite end of the leaf spring.

* * * * *